United States Patent [19]

Ishida

[11] Patent Number: 5,434,508
[45] Date of Patent: Jul. 18, 1995

[54] BATTERY CAPACITY MONITORING USING CONSUMED CURRENT AS MEASURED AND THROUGH A MODE TABLE

[75] Inventor: Masayoshi Ishida, Ora, Japan

[73] Assignee: Sanyo Electric Co., Ltd., Osaka, Japan

[21] Appl. No.: 133,648

[22] Filed: Oct. 7, 1993

[30] Foreign Application Priority Data

Oct. 13, 1992 [JP] Japan ................................. 4-274396

[51] Int. Cl.$^6$ .......................................... G01N 27/416
[52] U.S. Cl. ..................................... 324/427; 340/636
[58] Field of Search ............... 324/426, 427, 428, 436; 320/48; 340/636

[56] References Cited

U.S. PATENT DOCUMENTS

| | | | |
|---|---|---|---|
| 3,971,980 | 7/1976 | Jungfen et al. | 324/427 |
| 5,182,655 | 1/1993 | Motoyanagi | 340/636 |
| 5,317,269 | 5/1994 | Mills et al. | 324/427 |

FOREIGN PATENT DOCUMENTS

| | | | |
|---|---|---|---|
| 4002978 | 1/1992 | Japan | 324/427 |
| 4012285 | 1/1992 | Japan | 324/427 |

Primary Examiner—Kenneth A. Wieder
Assistant Examiner—Christopher M. Tobin
Attorney, Agent, or Firm—Spensley Horn Jubas & Lubitz

[57] ABSTRACT

The residual energy of a battery can accurately be displayed in real time even in electronic equipment which has greatly variable current consumption. A calculator unit in a battery pack measures an electric current supplied from a battery in the battery pack to the main body of a notebook type personal computer. If the measured current value is within a preselected range, it is used to calculate the residual energy of the battery. If the measured current value is out of the preselected range, the present operational mode of the main computer body is determined by mode display data obtained from an operational mode control circuit in the main computer body. A preselected current consumption corresponding to the judged operational mode is read out of a mode table in the battery pack and is used to calculate the residual energy of the battery. The calculated residual power of the battery is supplied to the operational mode control circuit as residual energy data which may be displayed on a sub LCD in real time.

10 Claims, 5 Drawing Sheets

| MODE DISPLAY DATA | | | MODE | |
|---|---|---|---|---|
| BIT 2 | BIT 1 | BIT 0 | OPERATIONAL MODE | CURRENT COMSUMPTION |
| 0 | 0 | 0 | NON-USE | 40 mA |
| 0 | 0 | 1 | NON-USE | 30 mA |
| 0 | 1 | 0 | NON-USE | 20 mA |
| 0 | 1 | 1 | SUSPEND MODE | 10 mA |
| 1 | 0 | 0 | MAIN POWER-OFF MODE | 0 mA |
| 1 | 0 | 1 | NON-USE | — |
| 1 | 1 | 0 | NON-USE | — |
| 1 | 1 | 1 | NORMAL MODE | — |

Fig. 4

BATTERY CAPACITY MONITORING USING CONSUMED CURRENT AS MEASURED AND THROUGH A MODE TABLE

BACKGROUND OF THE INVENTION

1. Field of the Invention

The present invention relates to electronic equipment suitable for use in personal computers and the like and particularly to a system for monitoring the residual energy of a battery in a battery-powered device.

2. Technical Background

Recently, notebook type battery-powered personal computers have been developed in the field of small-sized electronic equipment. When the battery power is consumed in such a device during operation, it will lead to serious problems in that the programs and data are destroyed. To avoid such serious problems, means for monitoring the residual power of the battery is required. The prior art has proposed a method of providing a battery monitoring program stored in the device itself to monitor the operation of the device while calculating the residual energy, or charge, of the battery at all times. However, it was difficult for such a battery monitoring program to indicate the residual energy of the battery in real time.

In equipment having a substantially constant current consumption such as a battery-powered razor, the residual energy of the battery can be calculated and indicated by a microcomputer mounted in the interior of a battery pack and adapted to detect the flow of electric current. In another type of equipment having a current consumption which is variable over a large range (e.g. a range between 100 milliamperes and several amperes) such as a notebook type personal computer, the electric current can not accurately be measured throughout its operational range even if it includes such a microcomputer as described above.

SUMMARY OF THE INVENTION

It is therefore an object of the present invention to provide a battery monitoring system which can accurately indicate the residual energy of a battery in real time even if it is used in electronic equipment having a greatly variable current consumption. Another object of the present invention is to provide a battery pack which can be used in conjunction with such a battery monitoring system.

In one aspect of the present invention, a battery monitoring system may comprise a battery for supplying an electric current to various parts in an electronic device, means for measuring the current consumption in the electronic device and calculating means for calculating the residual energy of said battery based on a measurement from the measuring means if the measurement is within a given range and for calculating the residual power of the battery based on a preselected current consumption corresponding to the operational mode of the device if said measurement is outside of the given range.

The battery monitoring system can calculate the residual power of the battery based on a measured current if the measured current is within a given range and on a preselected current consumption corresponding to the present operational mode of the device if the measured current is outside of the given range.

In another aspect of the present invention, there is provided a battery pack detachably mounted within an electronic equipment and adapted to supply an electric current to the electronic equipment. The battery pack comprises a battery for supplying an electric current to the electronic equipment, means for measuring the electric current supplied from the battery to the electronic equipment, a mode table for correlating the operational mode of the electronic equipment with a current consumption in that operational mode, and means for calculating the residual power of the battery based on a measured value from the measuring means if the measured value is within a given range and for reading a current consumption corresponding to the information of the operational mode provided by the electronic equipment from the mode table to calculate the residual energy of the battery on the read current consumption if the measured value in the measuring means is outside of the given range.

The battery pack can perform the processing operation through the calculating unit mounted therein in the same manner as in the aforementioned battery monitoring system.

In still another aspect of the present invention, the battery monitoring system further comprises a display in the electronic equipment, the display being adapted to indicate the residual power of the battery periodically calculated by said calculating means in real time.

The battery monitoring system can cause the display mounted in the electronic equipment to indicate the residual energy of the battery periodically calculated by the calculating means in real time.

In a further aspect of the present invention, the battery pack further comprises a display in the external surface of the battery pack exposed when it is mounted in the electronic equipment, the display being adapted to indicate the residual energy of the battery periodically calculated by said calculating means in real time.

The battery pack can cause the display mounted in the externally exposed surface of the battery pack to indicate the residual energy of the battery periodically calculated by the calculating means in real time.

BRIEF DESCRIPTION OF THE DRAWINGS

FIG. 4 illustrates the contents of the mode table shown in FIG. 2.

DETAILED DESCRIPTION OF THE PREFERRED EMBODIMENTS

The present invention will now be described with reference to the accompanying drawings which illustrate one embodiment of the present invention applied to a notebook type personal computer as exemplary electronic equipment.

Figure 1:
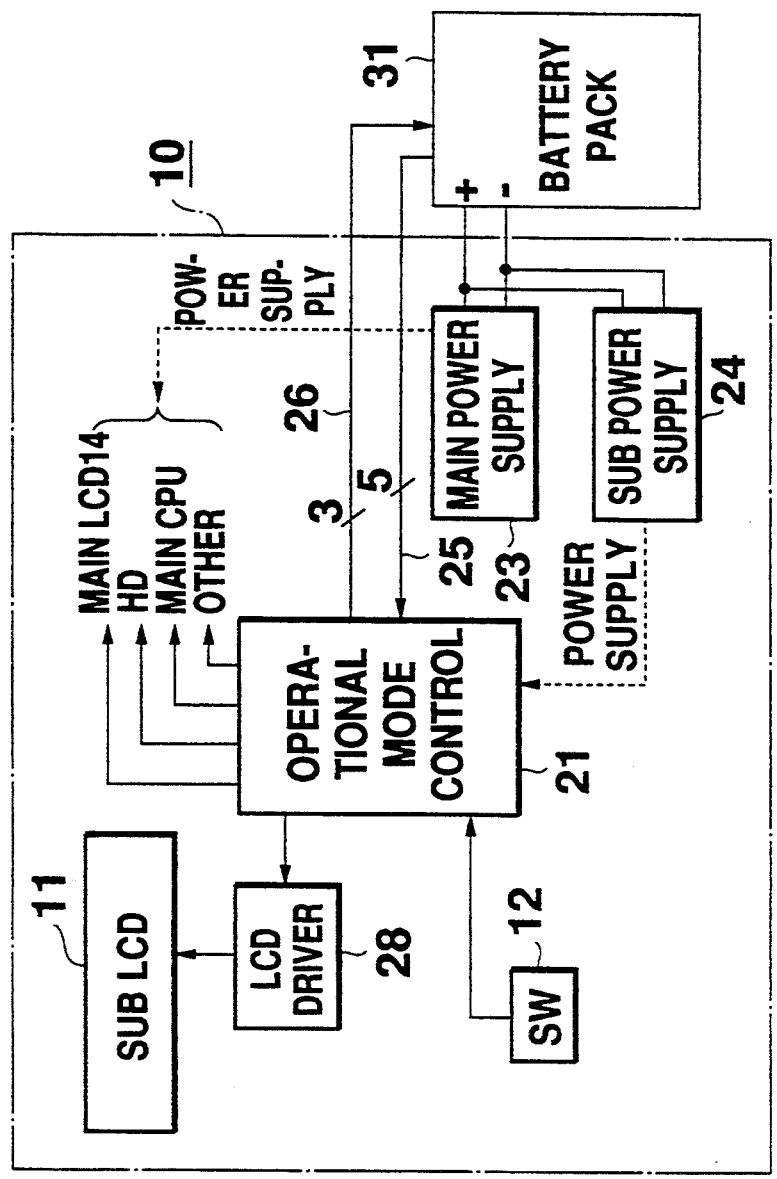
FIG. 1 is a block diagram illustrating the primary parts of a notebook type personal computer including a battery monitoring system to which one embodiment of the present invention is applied.
Figure 2:
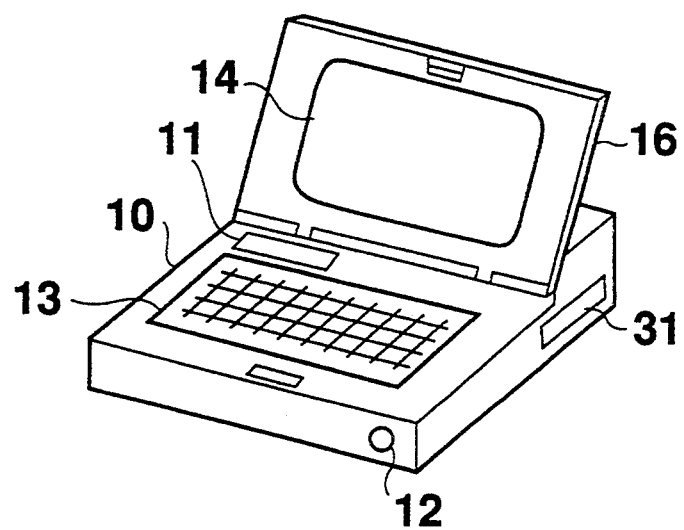
FIG. 2 is a perspective view illustrating the outline of the notebook type personal computer.

FIG. 1 shows the primary parts of the notebook type personal computer to which one embodiment of the present invention is applied while FIG. 2 shows the external appearance of the notebook type personal computer.

As can be seen from FIG. 2, the main body 10 of the notebook type personal computer includes a push-button type momentary actuator switch 12 at the front face thereof. Each time the switch 12 is depressed, the personal computer can be switched from a normal operation mode to a suspended mode in which various parts in the personal computer are interrupted in operation and placed in a sleep state or vice versa. The personal computer also includes an openable screen panel 16 having a large-sized liquid crystal display (hereinafter called "main LCD") 14. The main LCD 14 is adapted to indicate input data from a key board 13 and data generated in the interior of the personal computer. The personal computer further includes a small-sized sub LCD 11 disposed independently of the main LCD 14. The sub LCD 11 is adapted to indicate such system information as will be described later.

The personal computer may be powered by an electric current supplied thereinto from a battery pack 31 which is detachably mounted within the personal computer through the side opening thereof.

Referring now to FIG. 1, the main body 10 of the personal computer comprises an operational mode control circuit 21 for controlling the current consumption of various devices within the personal computer in the suspended mode and for controlling the sub LCD 11 through an LCD driver 28. The devices within the personal computer may include the main LCD 14, a hard disc (HD), a main CPU and others. The operational mode control circuit 21 is connected to the actuator switch 12. When the actuator switch 12 is depressed while the computer is in the normal operation mode, the operational mode control circuit 21 may perform a given control for shifting the from normal operation mode to the suspended mode. In the suspended mode, the main LCD 13 is turned off, the hard disc motor is stopped and the main CPU is placed in its hold state. The contents in the main memory (RAM), video memory (VRAM) and others as well as the necessary and minimum logic can be backed up by the battery. The operational mode control circuit 21 generates mode display data 26 indicating whether the personal computer is in the normal operation mode or suspended data. The mode display mode 26 is supplied to the battery pack 31.

The personal computer further includes main and sub power supplies 23 and 24 each of which is adapted to output a constant DC voltage by the use of the battery pack 31 as a source of energy. The sub power supply 24 is adapted to back up the operational mode control circuit 21 at all times independently of a power switch (not shown). The main power supply 23 begins to supply the electric power to various computer parts when the power switch is actuated.

Figure 3:
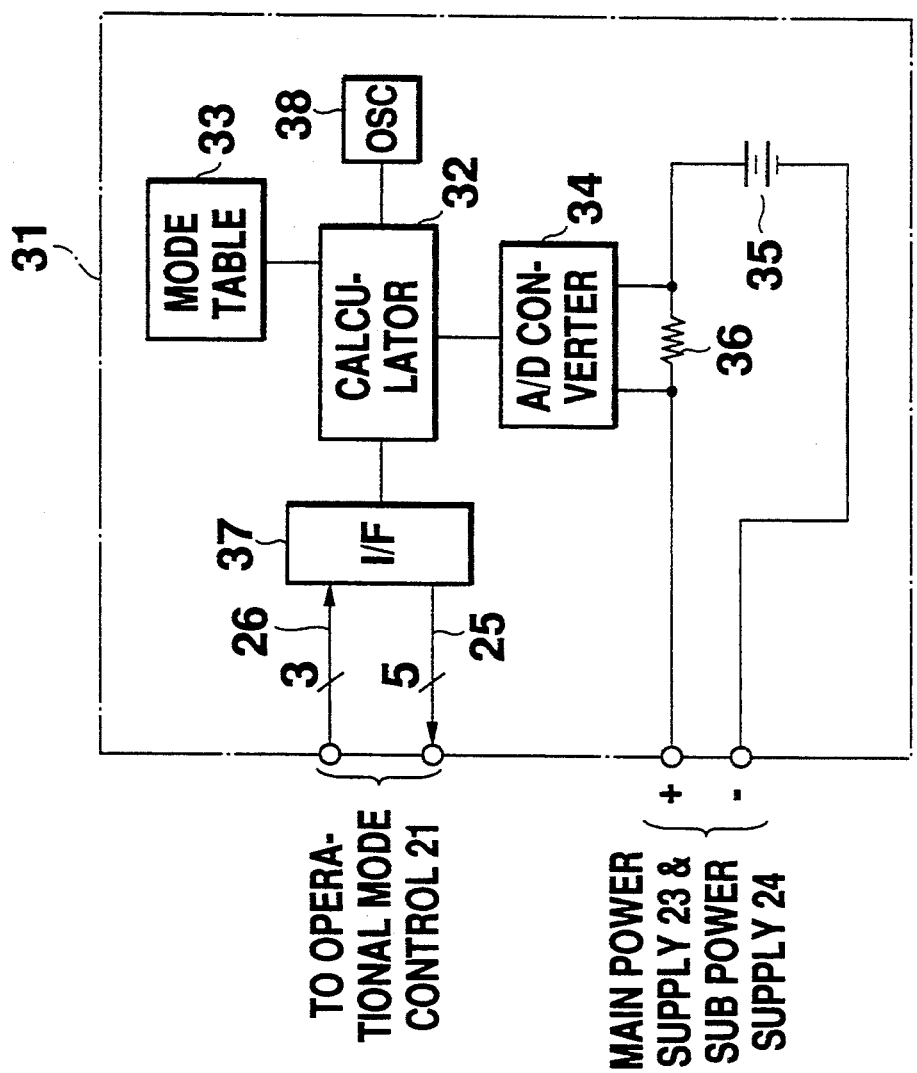
FIG. 3 is a block diagram illustrating the internal arrangement of the battery pack shown in FIG. 1.

FIG. 3 shows the internal details of the battery pack 31. A current detecting resistor 36 is connected in series with plus the battery 35. A voltage across resistor 36, proportional to the current flowing in resistor 36, is converted into a digital value by an analog/digital (A/D) converter 34, the digital value being then supplied to a calculator unit 32. The calculator unit 32 is operated with a predetermined clock frequency (e.g. 32 KHz) which is provided by an oscillator 38. The calculator unit 32 calculates an electric current flowing through the current detecting resistor 36, based on the digital value from the A/D converter 34. The calculator unit 32 performs a processing operation on the calculated current value. More particularly, if the detected current is equal to or higher than a given level (in this embodiment, its minimum measurable limit being 50 milliamperes, for example), the calculator unit 32 calculates the residual energy in battery 35 on the basis of the detected current value. If the detected current value is lower than the given level, the operational mode control circuit 21 in the main body 10 of the electronic equipment reads a current consumption corresponding to the mode display data 26 provided through an interface (I/F) 37 out of a mode table 33. Based on the read current consumption, the residual energy in battery 35 may be calculated by the calculator unit 32. The calculated value will be outputted through the interface 37 in the form of 5-bit residue data 25.

FIG. 4 shows the contents of the mode table 33. As seen from FIG. 4, the mode display data 26 from the operational mode control circuit 21 in the main computer body 10 is represented by three bits which can be combined to set eight operational modes. In this embodiment, there are three operational modes, that is, a suspended mode used to limit the current consumption in the personal computer at each device; a main power-off mode used to cause only the sub power supply 24 in the operational mode control circuit 21 to operate and to stop the main power supply 23; and a normal operational mode used to initiate the main and sub power supplies 23, 24 simultaneously. In the suspended mode, the current consumption may be equal to 10 milliamperes. In the main power-off mode, the current consumption may be equal to zero.

Figure 5:
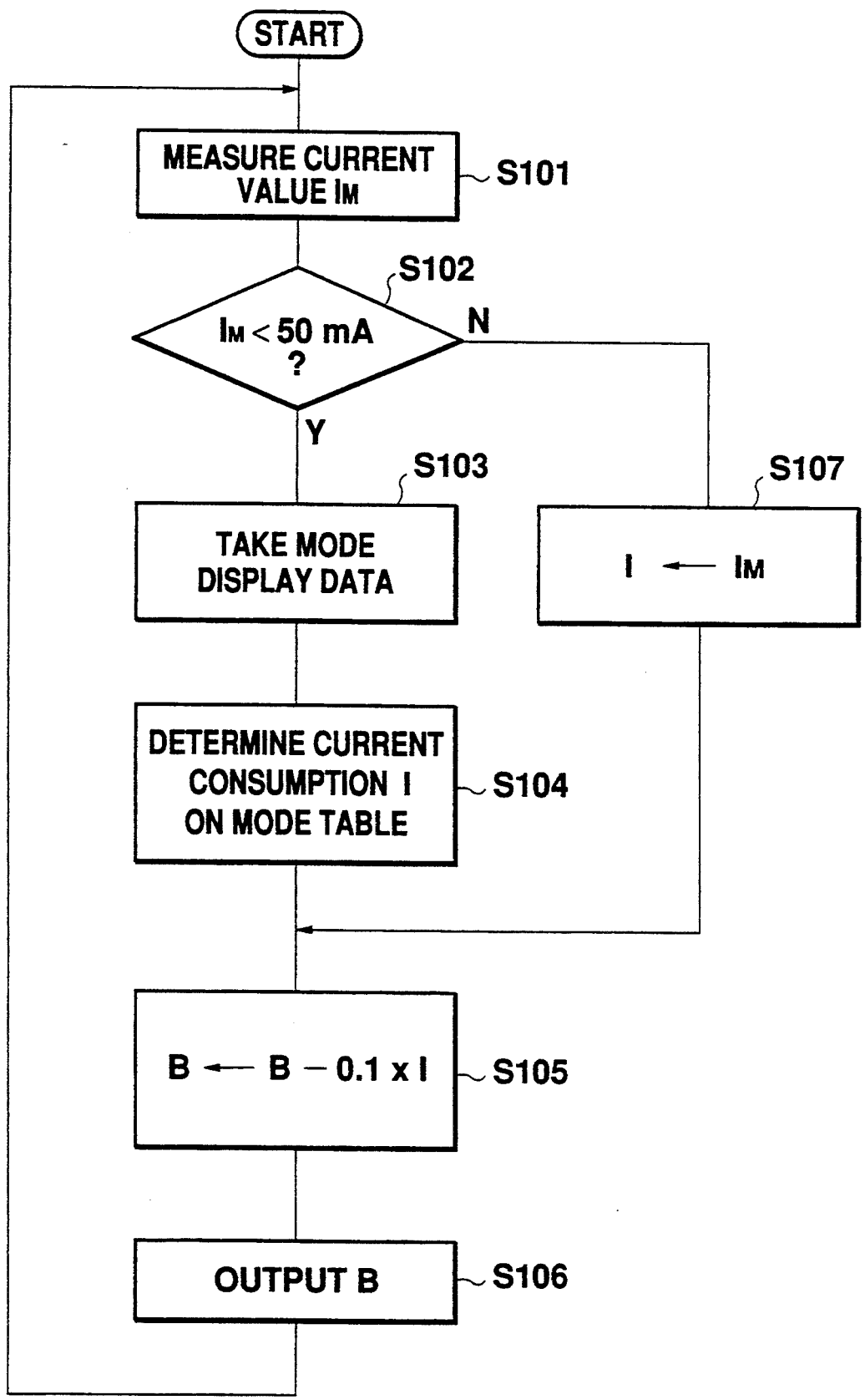
FIG. 5 is a flowchart illustrating the processing in the calculating unit shown in FIG. 3.

Referring also to FIG. 5, the operation of the notebook type personal computer will be described. The operational mode control circuit 21 in the main computer body 10 controls the operational modes in the personal computer and outputs the mode display data 26 corresponding to the present mode in real time. The calculator unit 32 in the battery pack 31 measures an electric current value $I_M$ supplied from battery 35 to the main computer body 10, based on the differential potential from the A/D converter 34 (step S101). If the measured current value is equal to or higher than 50 milliamperes (step S102; N), the measured current value $I_M$ is taken as a current consumption I (step S107) which is in turn used to calculate the residual energy in the battery 35 (step S105). The current value actually measured may broadly range between one milliampere and about 2.3 amperes. However, the current value cannot be accurately measured if it is below 50 milliamperes, as described.

It is now assumed that a processing cycle (S101–S106) in the flowchart of FIG. 5 is 10 Milliseconds. The calculator unit 32 calculates a new residual value B which is obtained by subtracting a value (0.1 seconds X I amperes) from the original (previous) residual value B.

If the measured value $I_M$ is lower than 50 milliamperes (step S102; Y), the calculator unit 32 judges that the measurement is impossible and takes the mode display data 26 to read a preselected current consumption corresponding to the mode display data 26 out of the mode table 33 (step S104). For example, if the mode display data 26 is "011", the calculator unit 32 judges that the present mode is the suspended mode and determines that the current consumption I is equal to 10 milliamperes. Based on the determined value, the same calculation as in the step S105 will be performed to determine the residual value B.

The calculator unit 32 feeds the resulting residual value B to the operational mode control circuit 21 in the main computer body 10 as 5-bit data 25 (step S106).

The operational mode control circuit 21 in the main computer body 10 outputs the residual data 25 from the battery pack 31 to the LCD driver 28, the residual data 25 being thus displayed on the sub LCD 11. Such a cycle of operations is carried out for each period of 100 milliseconds as described. Therefore, the residual energy in the battery pack 31 may be displayed on the sub LCD 11 in real time.

Although the preferred embodiment has been described as to the sub LCD 11 in the main computer body 10 for displaying the residual energy of the battery, the present invention is not limited to such an arrangement, but may be applied in various modifications, for example, in which the residual energy of the battery is displayed on part of the main LCD 14 or in which a small-sized LCD is disposed on the external face of the battery pack 31 exposed when it is mounted in the main computer body.

Where the residual energy of the battery is to be displayed on the main LCD 14, however, it may be switched off in the suspended mode. It is therefore more desirable that the residual energy of the battery is displayed on the sub LCD in the main computer body or the LCD on the external surface of the battery pack.

As will be apparent from the foregoing, the battery monitoring system or battery pack of the present invention can calculate the residual energy of the battery based on a measured current if the measured current is within a given range and on a preselected current consumption corresponding to the present operational mode of the device if the measured current is out of the given range. Therefore, the residual energy of the battery can accurately be monitored even in electronic equipment which has greatly variable current consumption.

Furthermore, the residual energy of the battery can be periodically calculated and displayed on the main computer body in real time. The user can always know the residual energy of the battery which is variable, from time to time.

I claim:

1. A battery monitoring system in combination with a battery for supplying an electric current to an electronic device which is operable in a selected one of a plurality of operational modes, said system comprising:
   a mode table in which a preselected current consumption is registered for each operational mode;
   measuring means connected for measuring the electric current consumption in the electronic device; and
   calculating means connected to said measuring means for calculating the residual energy stored in said battery based on measurements obtained by said measuring means when the current measured by said measuring means is within a given range and for calculating the residual energy stored in said battery based on a preselected current consumption registered in said mode table and independently of the measured current when the current measured by said measuring means is outside of the given range, wherein said calculating means comprise means for determining whether the current measured by said measuring means is within the given range.

2. A battery monitoring system as defined in claim 1 further comprising means connected in the electronic device for generating mode data indicative of the present operational mode of the electronic device and for supplying the generated mode data to said calculating means.

3. A battery monitoring system as defined in claim 1 wherein the operational modes corresponding to the preselected current consumptions registered in said mode table include at least a suspended mode in which the current consumption in the device is limited, a main power-off mode in which a main power source in the device is turned off and a normal mode in which the main power source and a sub power source are turned on simultaneously.

4. A battery monitoring system as defined in claim 1 wherein said calculating means includes means for a obtaining mode data indicative of the present operational mode of the device.

5. A battery monitoring system as defined in claim 1, further comprising a display in the electronic device, the display being adapted to indicate the residual energy of the battery periodically calculated by said calculating means in real time.

6. A battery monitoring system as defined in claim 5 wherein said display includes an exclusive display device disposed independently of a main display device.

7. A battery monitoring system as defined in claim 5 wherein said display includes a liquid crystal display device.

8. A battery pack detachably mountable to an electronic device, the electronic device being operable in a selected one of a plurality of operations modes, said battery pack comprising:
   a battery for supplying an electric current to the electronic device;
   a mode table in which a preselected current consumption is registered for each operational mode;
   measuring means connected for measuring the electric current consumption in the electronic device; and
   calculating means connected to said measuring means for calculating the residual energy stored in said battery based on measurements obtained by said measuring means when the current measured by said measuring means is within a given range and for calculating the residual energy stored in said battery based on a preselected current consumption registered in said mode table and independently of the measured current when the current measured by said measuring means is outside of the given range, wherein said calculating means comprise means for determining whether the current measured by said measuring means is within the given range.

9. A battery pack as defined in claim 8, further comprising a display in the external surface of the battery pack exposed when said battery pack is mounted in the electronic device, the display being adapted to indicate the residual energy of the battery periodically calculated by said calculating means in real time.

10. A battery pack as defined in claim 9 wherein said display includes a liquid crystal display device.

* * * * *